United States Patent
Bourk et al.

(10) Patent No.: US 6,292,062 B1
(45) Date of Patent: Sep. 18, 2001

(54) METHOD AND APPARATUS FOR IMPLEMENTING A HIGH-PRECISION INTERVAL TIMER UTILIZING MULTIPLE OSCILLATORS INCLUDING A NON-OPTIMAL OSCILLATOR

(75) Inventors: Terrance R. Bourk, La Jolla; Neal K. Riedel, Carlsbad, both of CA (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/502,281

(22) Filed: Feb. 10, 2000

(51) Int. Cl.[7] ....................................................... H04Q 3/00
(52) U.S. Cl. ............................... 331/46; 331/49; 327/144; 327/152; 713/322; 713/503; 368/118; 368/119
(58) Field of Search ........................ 331/46, 49; 713/322, 713/503; 327/144, 152; 368/118, 119

Primary Examiner—Arnold Kinkead
(74) Attorney, Agent, or Firm—Jaquez & Associates; Martin J. Jaquez, Esq.; Allan Y. Lee, Esq.

(57) ABSTRACT

The present invention is a novel method and apparatus for implementing a high-precision timer utilizing a non-optimal oscillator and a high-speed oscillator wherein only one oscillator is enabled at a given moment in time. The high-precision timer method and apparatus comprises a timer and an error-correction technique. In one embodiment, the timer of the present invention is constructed from a high-speed oscillator and a low-speed non-optimal oscillator. The timer operates from the high-speed oscillator during on-the-air modes of operation and from the low-speed non-optimal oscillator during sleep modes of operation. The present inventive method corrects errors that are introduced by the non-optimal oscillator and a swallow counter. The errors are corrected using an error-correction technique having two steps: an error-determination step and an error-correction step. In the preferred embodiment of the error-determination step, a total error for a time interval is determined by performing the following steps: (1) calculating an individual error that occurs at each pulse; (2) multiplying the individual error by the number of pulses occurring during the time interval; and (3) adjusting for a non-optimal counter. Once an error has been determined, the error-correction step adjusts a clock counter accordingly. Depending upon the error-correction technique used, the error-correction step can correct the total error at one of several locations within a timer counter chain that is used to practice the present invention. The implementation of the present invention allows a straightforward realization of multiple timers.

10 Claims, 6 Drawing Sheets

METHOD AND APPARATUS FOR IMPLEMENTING A HIGH-PRECISION INTERVAL TIMER UTILIZING MULTIPLE OSCILLATORS INCLUDING A NON-OPTIMAL OSCILLATOR

BACKGROUND OF THE INVENTION

1. Field of the Invention

This invention relates to oscillators for use in wireless devices, and more particularly to a method and apparatus for implementing a high-precision interval timer utilizing multiple reference oscillators including a non-optimal oscillator.

2. Description of Related Art

Timers, clocks and oscillators are essential to the performance of most modern electronic devices. Examples of devices that use clocks, oscillators and timers are commonplace. For example, digital timepieces (e.g., digital wristwatches), computers, videocassette recorders (VCRs), televisions, cordless telephones and wireless communication devices (e.g., cellular phones, pagers and Internet-enabled personal digital assistants (PDAs)) all have timers that generate internal clock signals that are used by the devices. Timers or clocks produce a desired clock rate by counting for a desired time interval. Examples of such time intervals include 1 second (i.e., operating at a 1 Hz clock rate) and 1 microsecond ($\mu$sec) (i.e., operating at a 1 MHz clock rate).

Typical timers are constructed using an oscillator and at least one counter. The timer construction depends upon the desired clock rate. The clock rate depends upon the nature of the timer as used within a particular device. In some simple electronic devices timers facilitate displaying time at a desired time interval. For example, a digital wristwatch device having a desired time interval of 1 second (1 Hz clock rate) can be constructed using a 32.768 kHz oscillator that is electronically coupled to a 15-bit counter. The 15-bit counter functions in a well-known manner to "divide down" the 32.768 kHz oscillator to 1 second (i.e., the most significant bit of the 15-bit counter changes its logical state at exactly one second intervals).

In complex electronic devices such as devices that operate according to the "Bluetooth Specification", timers are used to facilitate the synchronization of timing functions between two or more wireless communication devices. The Bluetooth protocol is a global specification standard for radio communications operating at 2.4 GHz radio frequencies. Bluetooth protocol devices (i.e., those that comply with the Bluetooth Specification) replace normal cable connections through short-range radio links. Bluetooth protocol technology is featured in cordless telephony, intercom, FAX and LAN access, and dial-up networking. Bluetooth wireless communication software protocols are implemented in PDAs, cell phones, cameras, printers, and other mobile devices. Bluetooth protocol devices are described in more detail in a specification produced by the Bluetooth special interest group (SIG), entitled "Bluetooth Specification Version 1.0B", electronically available to the public via the well-known Internet at <http://www.bluetooth.com/v2/document/default.asp>, published in December 1999, referred to hereinbelow as the "Bluetooth Spec.", and hereby incorporated for reference herein in its entirety for its teachings on Bluetooth signals, devices and communication protocols.

One well-known method of constructing Bluetooth protocol device timers (for use in Bluetooth enabled devices) operating at clock rates of 3.2 kHz, utilizes a 32 kHz oscillator coupled to a divide-by-ten counter. One major disadvantage of utilizing a 32 kHz oscillator is the increased cost associated with the manufacture of 32 kHz oscillators when compared to the extremely high-volume manufacturing of 32.768 kHz oscillators.

When Bluetooth devices are operating on a radio channel they utilize a high-speed high-accuracy oscillator whereby the oscillator is operatively coupled to a divide-by counter. "High-accuracy" or "high-precision" oscillators are defined herein as having relatively low errors. That is, the average clock rates or signal frequencies produced by high accuracy oscillators (as averaged over a long period of time) does not vary (or varies insignificantly) from the desired or advertised clock rate. Said in another way, the clock rates generated by high accuracy oscillators as defined herein vary only very slightly from the designed clock rates. High accuracy oscillators typically have inherent errors ranging between 5–20 parts per million ("PPM"). In contrast, "low accuracy" or "low precision" oscillators are defined herein as having more significant clock error, wherein the actual clock rates generated by the oscillators vary more significantly from the desired clock rates. Low accuracy oscillators typically have inherent error ranging between 100–200 PPM.

The Bluetooth Specification, and more specifically, the Bluetooth protocol requires use of a high-speed oscillator when a device operates in an "on-the-air mode". On-the-air mode is defined herein as an operating mode wherein the Bluetooth device is in active communication with another Bluetooth device. Conversely, "sleep mode" is defined herein as an operating mode wherein the Bluetooth device is not in active communication with another Bluetooth device. During on-the-air modes, the high-speed oscillator operates as a reference for symbol rate and radio frequency (RF), and also for the Bluetooth clock. Bluetooth high-speed oscillators have a wide range of clock rates such as 2 MHz to 64 MHz. The typical clock rate speed divides evenly down into a desired clock rate such as 3.2 kHz. For example, a Bluetooth protocol device timer operating at a clock rate of 3.2 kHz can be constructed from an 8 MHz oscillator, a divide-by-250 counter, and a divide-by-10 counter. In another example, a Bluetooth protocol device timer operating at a clock rate of 3.2 kHz can be constructed from a 32 MHz oscillator, a divide-by-1000 counter, and a divide-by-10 counter. One significant disadvantage associated with using high-speed oscillators is the significant power consumed by these oscillators.

One technique for constructing Bluetooth protocol device timers that overcomes the disadvantages associated with the techniques described above (i.e., the increased cost and power consumption), makes use of non-optimal low-speed oscillators, "swallow" counters, and divide-by counters. As used herein, a "non-optimal" oscillator is defined as an oscillator that produces a clock rate that cannot be divided evenly to produce a desired clock rate (i.e., a clock rate that is not an integer multiple of a desired clock rate). An "optimal" oscillator is defined herein as an oscillator that produces a clock rate that can be evenly divided (typically by using "divide by counters") to produce a desired clock rate.

In general, and all other factors being equal, low-speed oscillators consume relatively little power. Certain low-speed oscillators are relatively inexpensive to manufacture. An example of a relatively inexpensive low-speed oscillator is a 32.768 kHz oscillator that is used in the well-known digital wristwatch industry. As one skilled in the Bluetooth design art shall appreciate, desired lower clock rates can be derived from non-optimal low-speed oscillators by selectively deleting oscillator pulses. To maintain instantaneous clock rate accuracies (i.e., to minimize jitter in the timing of clock pulses), the pulse deletions are distributed as evenly as possible over a period of time. For example, a Bluetooth protocol timer (3.2 kHz clock rate) can be constructed by relying upon the observation that a 32 kHz clock rate can be derived from a 32.768 kHz oscillator by "swallowing" (i.e., deleting) 768 pulses per second. To maintain accuracy of the timer, the pulse deletions are distributed as evenly as possible. Exactly 3 pulses need to be deleted during every 128-pulse time interval of the 32.768 kHz oscillator to obtain a desired 32 kHz clock rate. Specifically, the swallow counter counts 42 pulses of the oscillator and deletes the $43^{rd}$ clock pulse; counts another 42 clock pulses and deletes the $43^{rd}$ clock pulse; and finally counts 41 pulses and deletes the $42^{nd}$ pulse. Accordingly, during a 128-pulse time interval (43+43+42) only 125 (42+42+41) pulses are counted by the swallow counter. A 32 kHz clock rate is thereby produced by the swallow counter. The swallow counter is operatively coupled to a divide-by-ten counter to produce a desired 3.2 kHz clock rate. One disadvantage of using non-optimal oscillators in a timer is the "jitter" that is inherently introduced by the process of swallowing clock pulses. At the time that a clock pulse is deleted, the resulting 32 kHz clock pulse train has a jitter having an interval of 2 clock periods of the 32.768 kHz oscillator.

Disadvantageously, the swallow counters used in these designs inherently produce "jitter" due to the non-optimal nature of the oscillators. Referring to the construction method described above, an oscillator pulse output generated from a 32.768 kHz oscillator is approximately 30.5176 microseconds in duration, whereas, a pulse generated from a 32.0 kHz oscillator is exactly 31.25 microseconds in duration. Thus, for every pulse counted by the swallow counter used in the above-described method, a time error linearly increases until a pulse is deleted. As such, the above-described Bluetooth protocol timer is perfectly accurate only every $125^{th}$ pulse. Any other pulse during a 125-pulse period has an error of up to one pulse in duration (approximately 30.5176 $\mu$sec). The error of up to 30.5176 $\mu$sec can adversely affect the performance of certain functions of wireless devices, including Bluetooth devices.

Therefore, a need exists for a method and apparatus for eliminating jitter in high-precision timers utilizing non-optimal oscillators. The method and apparatus should utilize inexpensive oscillators having higher frequencies than required by the system or wireless device. Such a method should consume relatively small levels of power. Further, a need exists for a high-precision timer that does not adversely affect the performance of a device that uses the timer. The present invention provides such a high-precision timer method and apparatus.

SUMMARY OF THE INVENTION

The present invention is a novel method and apparatus for implementing a high-precision timer utilizing a non-optimal oscillator and a high-speed oscillator wherein only one oscillator is enabled at a given moment in time. The present high-precision timer method and apparatus uses a combination of a timer and an error-correction technique. Advantageously, the present invention reduces power consumption through utilization of an inexpensive low-power, low-speed oscillator. In addition, an implementation of the present invention for use in devices conforming to the Bluetooth Specification allows a timer correction to be implemented when switching from a sleep mode to an on-the-air mode of operation.

The present invention comprises a timer constructed from a high-speed oscillator and a low-speed non-optimal oscillator. The timer operates from the high-speed oscillator during an "on-the-air mode" of operation and from the low-speed non-optimal oscillator during a "sleep mode" of operation.

In one embodiment, wherein the present invention is adapted for use with Bluetooth-conforming devices, the timer comprises an optimal high-speed (e.g. 8 MHz or 32 MHz) oscillator and an inexpensive non-optimal low-speed (e.g. 32.768 kHz or 33.536 kHz) oscillator. The clock counter operates from the optimal high-speed oscillator during "on-the-air modes" of operation and from the inexpensive non-optimal low-speed oscillator during "sleep" modes of operation.

In accordance with one embodiment of the present invention, the present method corrects errors introduced by the use of swallow counters using a two-step error-correction technique: an error-determination step and an error-correction step. In the error-determination step, a total error for a time interval is determined by performing the following steps: (1) calculating an individual error occurring at each pulse; (2) multiplying the individual error by the number of pulses occurring during the time interval; and (3) adjusting for the non-optimal counter. The individual error is a difference between the non-optimal oscillator clock rate pulse duration and a desired clock rate pulse duration.

In one embodiment, a Bluetooth-conforming timer (i.e., a timer that is adapted for use by a Bluetooth-enabled device) utilizes a non-optimal low-speed 32.768 kHz oscillator and a swallow counter during a sleep mode. The error-determination step of the present invention calculates an error at the time of waking from a sleep mode. The estimated error for a time interval is determined by performing the following steps: (1) calculating an error based on the counter state of the swallow counter, and (2) adjusting for the swallow counter by subtracting the total number of pulse durations swallowed during the time interval. Once an error has been determined, the error-correction step adjusts the clock counter accordingly.

Alternatively, the error-determination step of the present invention can be thought of as calculating a total error for a sleep-mode time interval. The total error for a time interval is determined by performing the following steps: (1) calculating an individual error occurring at each pulse; (2) multiplying the individual error by the total number of pulses occurring during the time interval; and (3) adjusting for the non-optimal counter by subtracting the total number of pulse durations swallowed during the time interval. Once an error has been determined, the error-correction step adjusts the clock counter accordingly. Depending upon the error-correction technique used, the error-correction step can correct the total error at any one of several selected locations within the timer of the present invention. Several embodiments of the error-correction technique are described in more detail below.

In a first error-correction technique for correcting a time error in accordance with the present invention, an approximate correction is mathematically determined based upon a desired clock rate and a counter range of a counter. The first error-correction technique can be implemented by injecting the approximate correction into the timer through a divide-by-250 counter and a divide-by-2 counter. A second error-correction technique for correcting a time error in a Bluetooth-conforming timer of the present invention relies upon the observation that an approximate correction can be mathematically determined based upon a desired clock rate and a counter range of a counter. The second error-correction technique can be implemented by injecting a delay value, based upon the approximate correction, into the timer through a countdown counter and a divide-by-6 counter. In yet another implementation of the second error-correction technique, the technique is implemented using a divide-by-6 counter and a switch.

A third error-correction technique for correcting a time error in a Bluetooth-conforming timer uses a microprocessor to control a sleep-mode interval for the device using that uses the timer. In accordance with this third error-correction technique, the correction for the swallow counter jitter can be applied together with the timer of the present invention to produce a high-precision interval timer having a high-speed oscillator and a low-speed non-optimal oscillator.

BRIEF DESCRIPTION OF THE DRAWINGS

Like reference numbers and designations in the various drawings indicate like elements.

DETAILED DESCRIPTION OF THE INVENTION

Figure 1:
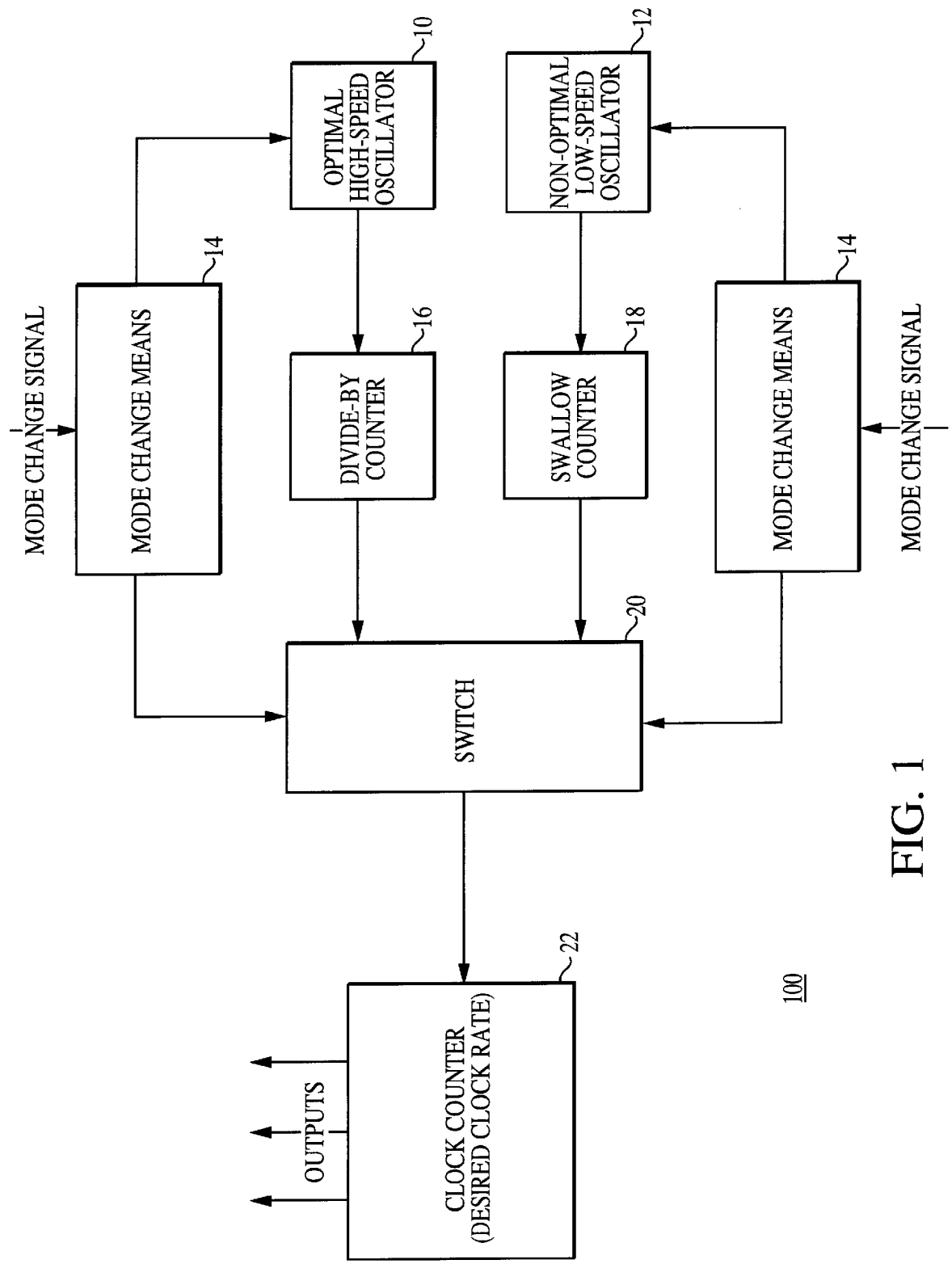
FIG. 1 is a block diagram of the preferred embodiment of a timer made in accordance with the present invention using a non-optimal low-speed oscillator and an optimal high-speed oscillator.

Throughout this description, the preferred embodiment and examples shown should be considered as exemplars, rather than as limitations on the present invention.

The preferred embodiment of the present invention is a method and apparatus for implementing a high-precision timer utilizing a non-optimal oscillator. Important objectives of timer design and manufacture are the reduction of manufacturing costs, reduction of power consumption and the enhancement of timer accuracy. The present invention reduces manufacturing costs and decreases power consumption by using an inexpensive low-speed oscillator such as a commercially available 32.768 kHz oscillator during a "sleep mode" of operation of a wireless communication device. The present invention increases timer accuracy through the use of an inventive error-correction technique.

The present inventive method and apparatus relies upon the observation that many existing wireless communication devices typically have two modes of operation: "on-the-air mode" and "sleep mode". On-the-air operation modes are defined herein as modes of operation in a wireless communication device wherein the wireless communication device is in active communication with another wireless communication device. Sleep mode is defined herein as a mode of operation in a wireless communication device where the wireless communication device is not in communication with another wireless communication device. Communication devices typically require high-speed timing during on-the-air modes of operation. However, during sleep modes of operation, low-speed timing can be employed in order to conserve power consumption. The present invention utilizes a high-speed oscillator during on-the-air modes of operation and a low-speed non-optimal oscillator during sleep modes of operation.

One of ordinary skill in the art shall recognize that other oscillators can be used without departing from the scope of the present invention as long as at least one oscillator is non-optimal (i.e., a need exists for an error correction method) and at least one oscillator is a high-speed oscillator (i.e., an oscillator is available to help correct jitter produced by the non-optimal oscillator). The use of a low-speed non-optimal oscillator decreases the overall power consumption of the wireless device. The present invention also implements an error-correction technique to compensate for errors introduced by the low-speed non-optimal oscillator used when the wireless device is in a sleep mode of operation.

In a first embodiment, the present inventive method and apparatus preferably comprises at least one non-optimal oscillator and at least one high-speed oscillator working in conjunction with an error-correction technique. In this embodiment, a high-speed optimal oscillator and a low-speed non-optimal oscillator are alternately used as clock sources. Although only two oscillators are used in this embodiment, this is not meant to be a limitation of the present invention as one of ordinary skill in the art shall recognize that more than two oscillators can be used. The first embodiment of the present invention using two oscillators is described in detail below.

The present inventive method and apparatus implements an error-correction technique for correcting the inherent inaccuracies introduced by the use of non-optimal oscillators. The error-correction technique preferably comprises two steps: an error-determination step and an error-correction step. The error-correction technique compensates for timing errors that are introduced by a non-optimal oscillator. In accordance with the present invention, a high-speed oscillator is used to implement the error correction. Several embodiments of the error-correction technique of the present invention are described in detail below. The embodiments described are not intended to be a limitation to the present invention as one of ordinary skill in the timer design art shall recognize that alternative methods of implementing a correction through the use of a high-speed oscillator can be used.

A first error-correction technique for correcting timing errors in a Bluetooth-conforming timer of the present invention (i.e., a timer adapted for use in a Bluetooth-enabled device) relies upon the observation that an approximate timing error correction can be mathematically determined based upon a desired clock rate and a counter range of a counter. The first error-correction technique is implemented by injecting an approximate error correction into the inventive timer using a divide-by-250 counter and a divide-by-2 counter. Similarly, a second error-correction technique for correcting timing errors in a Bluetooth timer relies upon an observation that an approximate error correction is mathematically determined from a desired clock rate and a counter range of a counter. The second error-correction technique is implemented by injecting a delay (based upon an approximate error correction) into the Bluetooth timer using a countdown counter and a divide-by-6 counter. In another embodiment of the second error-correction technique, the technique is implemented using a divide-by-6 counter and a switch. A third error-correction technique for correcting a timing error in a Bluetooth timer relies upon the observation that a sleep-mode interval can be estimated using a microprocessor. Any one of the inventive error-correction techniques can be combined with a timer of the present invention to implement the inventive high-precision interval timer.

Timer Construction Utilizing Non-Optimal Oscillators—A First Preferred Embodiment The present inventive method and apparatus preferably includes a counter and at least two oscillators. The preferred embodiment of the present invention includes a high-speed optimal oscillator and a low-speed non-optimal oscillator. The counter is preferably clocked by the high-speed optimal oscillator during on-the-air modes of operation, and by the low-speed non-optimal oscillator during sleep modes of operation.

FIG. 1 shows a block diagram of the preferred embodiment of a timer 100 of the present invention using two oscillators. An optimal high-speed oscillator 10 outputs a first clock rate signal. The first clock rate signal is input to a divide-by counter 16 as shown in FIG. 1. The divide-by counter 16 outputs a first clock signal at a desired clock rate to a first input of a switch 20. Similarly, a non-optimal low-speed oscillator 12 outputs a second clock signal (operating at a second clock rate). The second clock signal is input to a swallow counter 18. The swallow counter 18 deletes, in a well-known manner, several pulses over a selected time interval and outputs a signal at a desired clock rate that is provided as input to a second input of the switch 20. The use of the swallow counter 18 is not meant to be a limitation to the present invention. One of ordinary skill in the art shall recognize that other counters can be used without departing from the scope or spirit of the present invention.

The switch 20 outputs either an optimal clock signal or a non-optimal clock signal depending upon the mode of operation of the wireless device that uses the timer 100 of FIG. 1. The switch 20 has inputs from the first clock signal (from the divide-by counter 16) and the second clock signal (from the swallow counter 18). The first clock signal is also referred to as an "optimal" clock signal, where the second clock signal is also referred to as a "non-optimal" clock signal. During "on-the-air" modes of operation, the switch 20 outputs the optimal clock signal. During "sleep modes" of operation, the switch 20 outputs the non-optimal clock signal. The switch 20, the optimal high-speed oscillator 10 and the non-optimal low-speed oscillator 12 are preferably operationally coupled to a mode change means 14.

The mode change means 14 preferably provides a means for switching timer operation between operating modes such as on-the-air and sleep modes. When a mode change occurs, a mode change indication is transmitted to the mode change means 14. After changing operating modes from sleep mode to on-the-air mode, an error correction technique is implemented to compensate for errors that are introduced by the non-optimal low-speed oscillator 12. Error correction techniques are described hereinbelow.

When changing operating modes from a sleep mode to an on-the-air mode, the mode change means 14 powers on the optimal high-speed oscillator 10, powers off the non-optimal low-speed oscillator 12, and sets the switch 20 to output the optimal clock signal output by the divide-by counter 16, providing this signal as input a clock counter 22. When changing modes from on-the-air mode to a sleep mode, the mode change means 14 preferably turns power off to the optimal high-speed oscillator 10, switches power on to the non-optimal low-speed oscillator 12, and sets the switch 20 to output the non-optimal clock signal output by the swallow counter 18, providing this signal as input to the clock counter 22. The clock counter 22 outputs a signal having a desired clock rate and provides various outputs based on the desired clock rate. The clock counter 22 is not described in more detail herein.

Bluetooth Timer Construction Utilizing Non-Optimal Oscillators

In accordance with the Bluetooth Specification, the required Bluetooth operating clock rate is 3.2 kHz. The Bluetooth timer preferred embodiment of the present invention comprises a timer constructed from a high-speed 8 MHz oscillator and an inexpensive low-speed 32.768 kHz oscillator. The clock counter operates from the high-speed 8 MHz oscillator during on-the-air mode and from the low-speed 32.768 kHz oscillator during sleep mode. Although the Bluetooth timer preferred embodiment of the present invention utilizes an 8 MHz oscillator as a high-speed optimal oscillator, one of ordinary skill in the timer design art shall recognize that other oscillators can be used without departing from the scope of the present invention. For example, a 64 MHz oscillator or a 32 MHz oscillator can be utilized as a high-speed optimal oscillator. Similarly, low-speed oscillators other than 32.768 kHz oscillators can be used to practice the invention. For example, a 33 kHz or a 33.536 kHz oscillator can be utilized as a low-speed oscillator.

Figure 2:
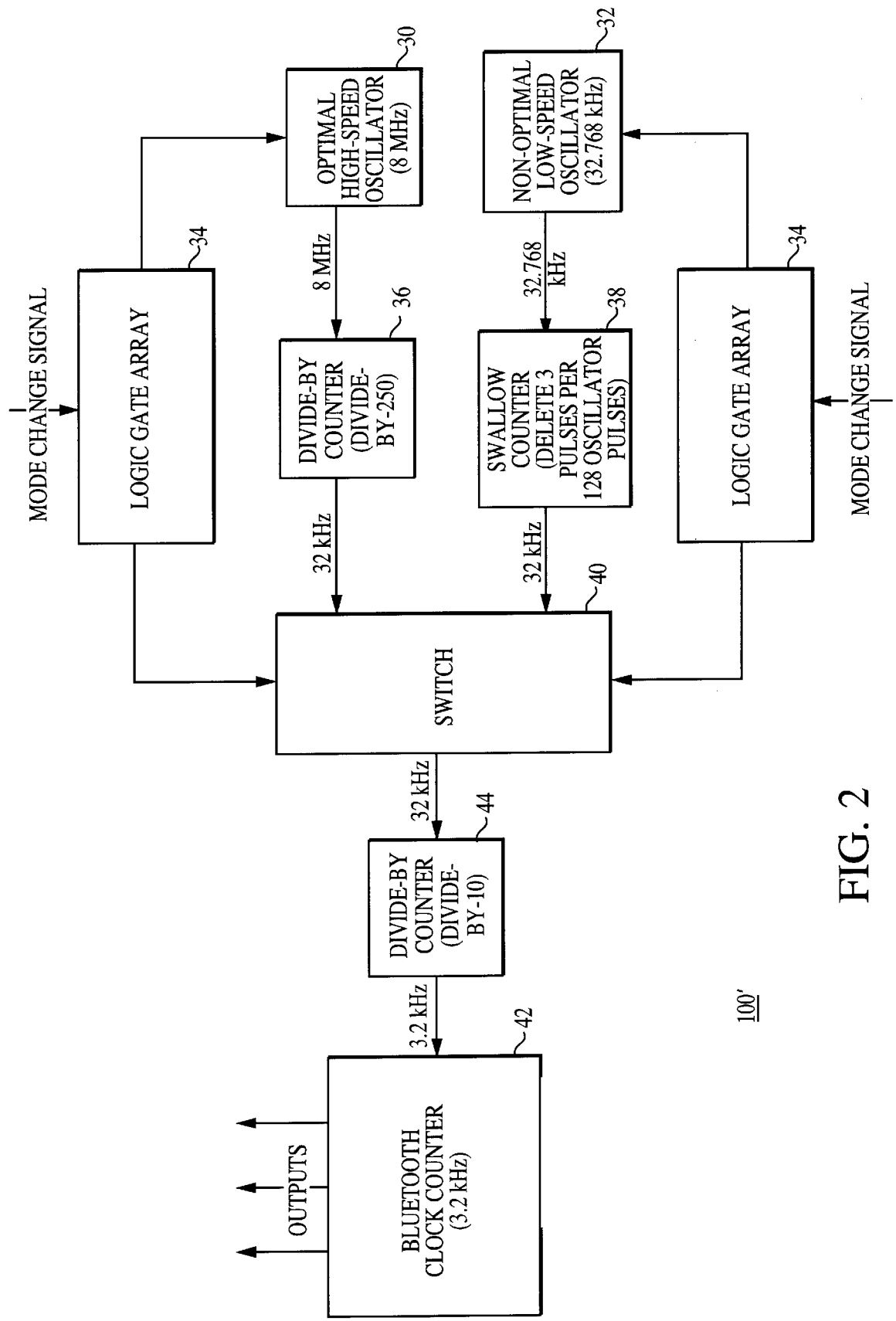
FIG. 2 is a block diagram of an alternative embodiment of the present invention adapted for use in a wireless device that operates in accordance with the Bluetooth Specification.

FIG. 2 shows a block diagram of an alternative embodiment 100' of the present invention adapted for use in a wireless device operating in accordance to the Bluetooth Specification. As shown in FIG. 2, a high-speed 8 MHz oscillator 30 outputs an 8 MHz clock signal. This signal is provided as input to a divide-by-250 counter 36. The divide-by-250 counter 36 outputs a high-speed 32 kHz clock signal to a first input of a switch 40. Similarly, a low-speed 32.768 kHz oscillator 32 outputs a 32.768 kHz clock rate signal that is input to a swallow counter 38. In a manner that is well-known in the counter art, the swallow counter 38 preferably deletes 3 pulses per 128 clock pulses, and outputs a non-optimal 32 kHz clock signal to a second input of the switch 40. The present invention is not limited to the use of high-speed and low-speed oscillators described above as other alternative embodiments that utilize high-speed optimal oscillators and low-speed non-optimal oscillators having other clock speeds can be used to practice the present invention.

For example, in a first alternative embodiment of a Bluetooth timer of the present invention, a 33.536 kHz oscillator can be utilized as a low-speed non-optimal oscillator instead of the 32.768 kHz oscillator 32 shown in FIG. 2. Accordingly, in this alternative, in a manner that is well-known in the art, the swallow counter 38 deletes 6 pulses per 131 pulses and outputs a non-optimal 32 kHz clock signal to the input of the switch 40. In a another alternative embodiment of a Bluetooth timer of the present invention, a 64 MHz oscillator can be utilized as a high-speed optimal oscillator instead of the 8 MHz oscillator 30 shown in FIG. 2. Accordingly, in this alternative, in a manner that is well known in the art, a divide-by-2000 counter is utilized instead of the divide-by-250 counter 36 to obtain the desired 32 kHz clock rate.

In accordance with the Bluetooth timer 100' of the present invention shown in FIG. 2, the switch 40 outputs either an optimal 32 kHz clock signal or a non-optimal 32 kHz clock signal depending upon the mode of operation of the wireless device that uses the timer 100. The switch 40 inputs the optimal 32 kHz clock signal generated by the output of the divide-by-250 counter 36 and inputs the non-optimal 32 kHz clock signal received from the output of the swallow counter 38. During on-the-air modes of operation, the switch 40 outputs the optimal 32 kHz clock signal. During sleep modes of operation, the switch 40 outputs the non-optimal 32 kHz clock signal. The switch 40, the high-speed 8 MHz oscillator 30, and the low-speed 32.768 kHz oscillator 32 are operatively coupled to a mode change means logic gate array 34 as shown in FIG. 2.

Timer 100' shown in FIG. 2, the mode change means is a logic gate array 34. The logic gate array 34 provides a means for changing timer 100' operation between the on-the-air operating modes and sleep operating modes. Alternatively, the mode change means can comprise software or firmware instructions that are executed by any convenient or desirable sequencing device such as a state machine, present state-next state discrete logic, or field programmable gate array device. In another alternative embodiment, the present mode change means is "hardwired" into the timer and implemented using either discrete logic devices, large scale integrated (LSI) devices, very large scale integrated (VLSI) devices, or application specific integrated circuit (ASIC) devices.

In the preferred embodiment, a Bluetooth enabled device implements a mode change in the present invention using the following techniques. The Bluetooth enabled device transmits a mode change signal to the gate logic array 34. When changing modes from a sleep mode to an on-the-air mode, the gate logic array 34 turns power on to the high-speed 8 MHz oscillator 30, turns power off to the low-speed 32.768 kHz oscillator 32 and controls the switch 40 to route the optimal 32 kHz clock signal from the output of the divide-by-250 counter 36 to the input of a divide-by-10 counter 44. When changing modes from the on-the-air mode to the sleep mode, the gate logic array 34 turns power off to the high-speed 8 MHz oscillator 30, turns power on to the low-speed 32.768 kHz oscillator 32, and controls the switch 40 to route the non-optimal 32 kHz clock signal output by the swallow counter 38, to the input of the divide-by-10 counter 44. The divide-by-10 counter 44 produces a 3.2 kHz clock rate signal to the input of the Bluetooth clock counter 42. The Bluetooth clock counter 42 provides various outputs based upon the 3.2 kHz clock rate signal.

One potential drawback of using a non-optimal, low-power oscillator clock signal during sleep mode operation is that errors can be introduced by the operation of the swallow counter 38. However, advantageously, these swallow counter-induced errors can be determined and compensated. For example, an error correction can be determined and implemented when the operation mode changes from a sleep mode to an on-the-air mode (i.e., when switching between a non-optimal mode to an optimal mode). The error correction techniques of the present invention are now described in detail.

Error-Correction Techniques

The present inventive method and apparatus corrects errors that are introduced by the operation of swallow counters when used to obtain lower clock frequency (i.e., jitter errors introduced by the swallow counters). The error correction technique is preferably implemented in two steps: an error-determination step and an error-correction step. The error-determination step relies upon the observation that a total error can be estimated for any time interval beginning from the time when a clock tick of a desired clock rate is aligned with a clock tick of an actual clock rate. For example, in a Bluetooth implementation, a total error can be estimated for any time interval beginning from the time when a 32 kHz clock tick is aligned with an actual 32.768 kHz clock tick.

Figure 3:
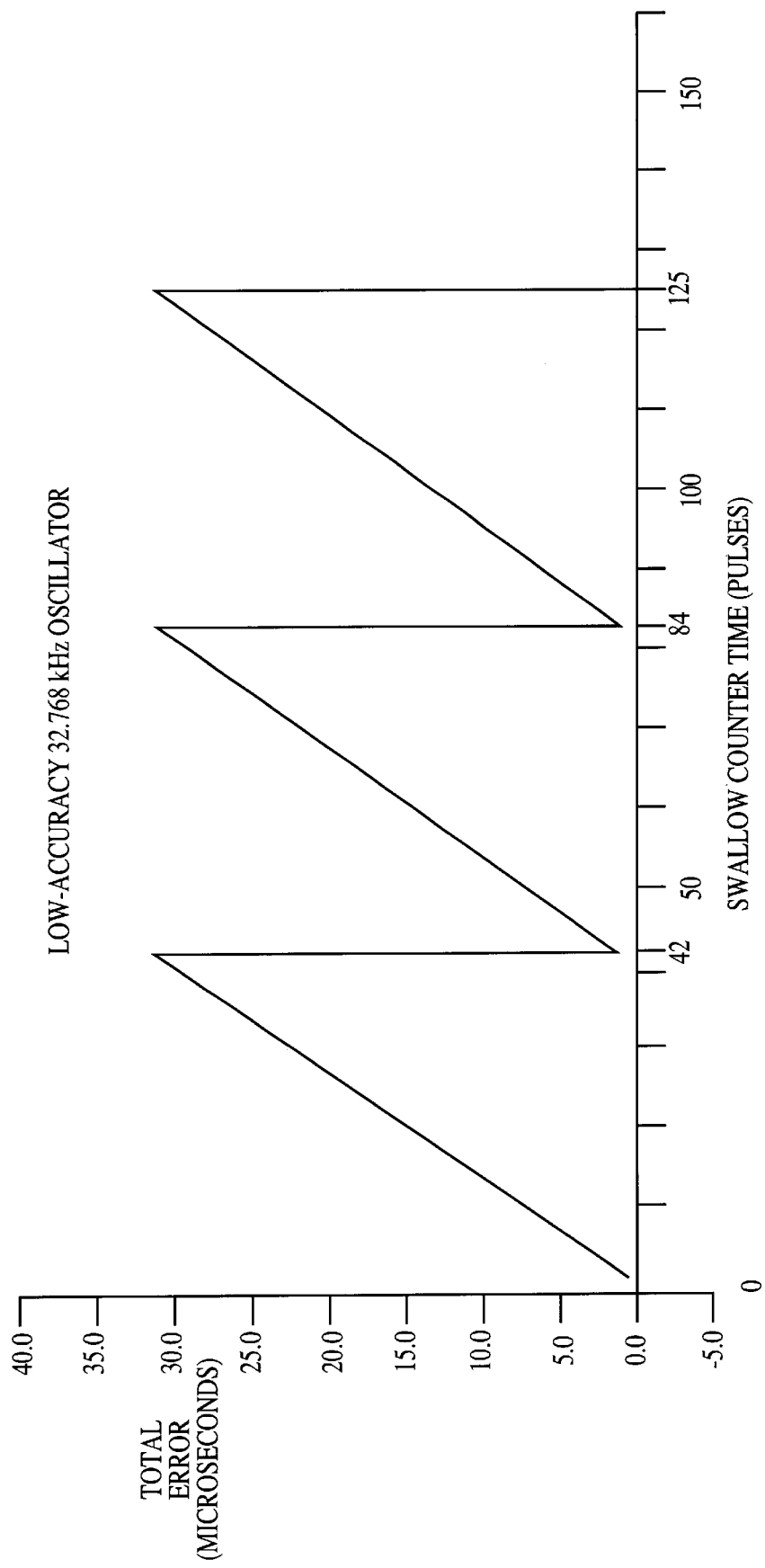
FIG. 3 is a timing diagram showing a total error over a 125-pulse time interval in the swallow counter of FIG. 1.

FIG. 3 shows the linearity of total error over a 125-pulse time interval for the timer 100' described above with reference to in FIG. 2, wherein the timer operates in a "sleep mode". As shown in FIG. 3, a total error during a time interval from swallow-counter pulse 1 to swallow-counter pulse 42 linearly increases owing to the cumulative error effect generated by each non-optimal clock pulse. At swallow-counter pulse 42 the total error is adjusted by deleting the $43^{rd}$ pulse of the 32.768 kHz oscillator 32. Thus, at swallow-counter pulse 42 the total error is reduced to almost zero. A similar linear error effect occurs during a time interval between swallow-counter pulse 42 and swallow-counter pulse 84. Again, at swallow-counter pulse 84 the total error is adjusted by deleting the $86^{th}$ pulse of the 32.768 kHz oscillator 32. Thus, at swallow-counter pulse 84 the total error is reduced to almost zero. The total error similarly linearly increases during the time interval between the swallow-counter pulse 84 and the swallow-counter pulse 125. At swallow-counter pulse 125, the total error is adjusted by deleting the $128^{th}$ pulse of the 32.768 kHz oscillator 32. Thus, at swallow-counter pulse 125 the total error is exactly equal to zero.

A preferred embodiment of the error-determination step is described hereinbelow wherein the error determination is made for a timer used to function within a Bluetooth-conforming wireless device. As one of ordinary skill in the art shall recognize, the present inventive method and apparatus is not limited to correcting errors introduced by a non-optimal 32.768 kHz oscillator in a system requiring a 32.0 kHz clock rate. The present error correction technique can be used to correct errors that are introduced by non-optimal oscillators having other clock speeds. For example, errors introduced by a 32.0 kHz oscillator in a system requiring a 31.744 kHz clock rate can be corrected using the present error correction technique.

In a Bluetooth embodiment of the present invention, the error-determination step calculates an estimate of the accumulated error for a timer interval based on a 32.768 kHz clock rate of a non-optimal oscillator and a desired 32.0 kHz clock rate. The error correction step utilizes an error value from the error-determination step and corrects the error value through a high-speed 8 MHz oscillator operatively coupled to a correction means. In a first alternative Bluetooth embodiment, the error-determination step calculates a total error for a time interval based on a 33.536 kHz clock rate of a non-optimal oscillator and a desired 32.0 kHz clock rate. The error correction step utilizes an error value from the error-determination step and corrects the error value using a high-speed 64 MHz oscillator operatively coupled to a correction means. The oscillator clock speeds described herein are not meant to be a limitation to the present invention as one of ordinary skill in the oscillator design art shall recognize that other oscillator clock speeds can be utilized without departing from the scope of the present invention.

Referring to the timer 100' of FIG. 2, the Bluetooth timer preferably utilizes a low-speed 32.768 kHz oscillator 32 and a swallow counter 38 during sleep modes of operation. As described above, a Bluetooth protocol device has a desired clock rate of 32.0 kHz. Thus, jitter occurs on the clock produced during sleep modes of operation. The error-determination step of the present invention calculates an estimate of the accumulated error for any sleep-mode time interval.

The total error for a time interval is determined by performing the following steps: (1) calculating an individual error occurring at each pulse; (2) multiplying the individual error by the number of pulses occurring during the time interval; and (3) adjusting for a non-optimal counter by subtracting the total number of pulse durations that are swallowed during the time interval. An individual error is determined by subtracting the 32.768 kHz oscillator pulse duration from the 32.0 kHz desired clock rate pulse duration. A 32.768 kHz oscillator pulse duration is approximately 30.5176 microseconds. A 32.0 kHz oscillator pulse duration is exactly 31.25 microseconds. Thus, the individual error is approximately 0.7324 microseconds (i.e., 31.25 subtracted by 30.5276).

The total error is determined by multiplying 0.7324 by the total number of pulses occurring within the time interval, and subtracting the number of pulses swallowed during the time interval. For example, a preferred embodiment of a timer operating in a Bluetooth sleep mode for a 45-pulse time interval has a total error of 0.7324 multiplied by 45 (the number of pulses during the time interval) and subtracted by 1 pulse duration (the number of pulses swallowed). In the preferred embodiment, pulse 43 is swallowed during a 45-pulse interval. Thus, the total error is approximately 2.44 microseconds ((0.7324*45)−30.5176). Once an error has been determined, the error-correction step adjusts the clock counter accordingly using a high-speed oscillator and a correction means.

As one of ordinary skill in the art shall recognize the error-correction techniques of the present invention can be used with other timer embodiments having a non-optimal oscillator and a high-speed oscillator. For example, a 33.536 kHz non-optimal oscillator and a 64 MHz oscillator can be used with the error-correction technique of the present invention.

Depending upon the error-correction technique used, the error-correction step can correct the total error at one of several locations within the timer of the present invention. The error-correction techniques described hereinbelow are described as being implemented in a Bluetooth preferred timer. The Bluetooth preferred timer implementation is meant to be exemplary only as one of ordinary skill in the art shall recognize that other timer implementations can be used without departing from the scope of the present invention. Three error-correction techniques are described in detail below.

A First Technique for Correcting a Time Interval Error in a Bluetooth Timer

A first error-correction technique for correcting a time error in a Bluetooth timer of the present invention relies upon the observation that an approximate correction can be mathematically determined based upon a desired clock rate and a known counter range of the swallow counter 38 (FIG. 2). An implementation of the first error-correction technique is described below with reference to FIG. 4. The desired clock rate of a Bluetooth timer is 3.2 kHz (or 32 kHz divided by ten). The counter range (i.e., the range of values within a counter) of the swallow counter 38 varies from 0 to 41 and from 0 to 42 depending on the swallow counter-pulse value (see FIG. 3). The first error-correction technique relies upon the observation that ⅔ multiplied by 64 is approximately 42.6 (i.e., a number between 42 and 43). Thus, an approximate correction, as measured in fractions of a 32 kHz clock rate, can be calculated using Equation 1 below:

approximate correction=[(swallow counter value) *1.5]／64.            (Equation 1)

The approximate correction can be applied in the timer by injecting it into the timer at an appropriate location in the counter chain of the counter.

This approximate correction is derived from a Bluetooth timer having a 32.768 kHz oscillator. One of ordinary skill in the art shall recognize that Equation 1 requires different constant values when other non-optimal low-speed oscillators are utilized. For example, in an embodiment utilizing a 33.536 kHz oscillator, an approximate correction as measured in fractions of a 32 kHz clock rate can be calculated using Equation 2 below:

approximate correction=[(swallow counter value) *3]／64.            (Equation 2)

Figure 4:
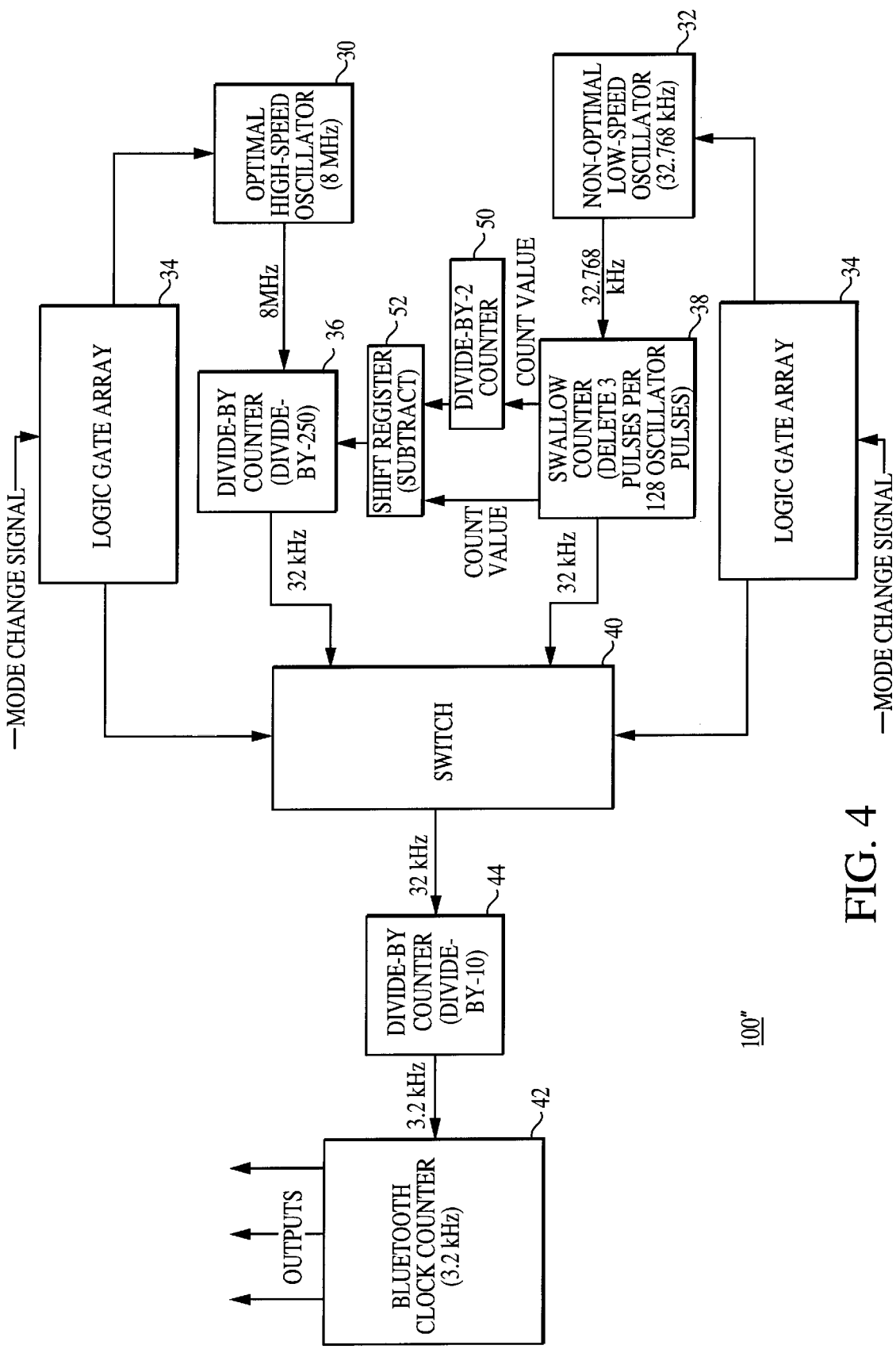
FIG. 4 shows a block diagram of a timer made in accordance with the present invention implementing the first error-correction technique for correcting a time error.

FIG. 4 shows a block diagram of a Bluetooth enabled timer 100″ made in accordance with the present invention wherein the first error-correction technique for correcting a time error is used. As shown in FIG. 4, and described in more detail below, an approximate correction can be injected into the Bluetooth timer at an appropriate location in the counter chain of the divide-by-250 counter 36. The correction is injected into the appropriate location of the counter 36 from a shift register 52 and a divide-by-2 counter 50. Alternatively, a shift register can be used in a well-known manner to produce the desired divide-by-2 effect instead of using the divide-by-2 counter 50.

When the timer changes modes from a sleep mode to an on-the-air mode, the approximate correction is injected into the counter 36 as follows. The swallow counter 38 first outputs a count value to the input of the divide-by-2 counter 50 and to the input of the shift register 52. At the same time, the low-speed 32.768 kHz oscillator 32 also is powered off. The divide-by-2 counter 50 then preferably outputs a divide-by-2 count value to the input of the shift register 52. Because a count value has already been input to the shift register 52 from the swallow counter 38, a value equaling 1.5-times the count value is now stored within the shift register 52.

The shift register 52 then adds a shifted divide-by-2 count value to the divide-by-250 counter 36. Specifically, the shift register 52 shifts its value (output by the divide-by-2 counter 50) to add the 1.5-times the count value to the $2^{nd}$ to $7^{th}$ bits to the right (or "less significant" bits) of a 32 kHz flip-flop bit in the divide-by-250 counter 36. The high-speed 8 MHz oscillator is powered on and the switch 40 routes the output clock signal of the counter 36 (the optimal clock signal) to the counter 44. The approximate error correction is thereby implemented.

Although the first error correction technique of the present invention implements Equation 1 utilizing a divide-by-2 counter 50 and a shift register 52 as shown in FIG. 4, the present invention is not so limited as one of ordinary skill in the art shall recognize that other methods of implementing Equation 1 can be used. Other approximate correction means can therefore be used without departing from the scope of the present invention.

A Second Technique for Correcting a Time Interval Error in a Bluetooth Timer

A second error-correction technique for correcting a time error in a Bluetooth-enabled timer relies upon the observation that an approximate correction can be mathematically determined from Equation 1. An implementation of the second error-correction technique relies upon the observation that the counter range of the divide-by-250 counter 36 (FIG. 2) is linearly related to the counter range of the swallow counter 38. The counter range of the divide-by-250 counter 36 is 0 to 249. The counter range of the swallow counter 38 is either 0 to 41, or 0 to 42. Thus, a correction can be implemented by dividing the 8 MHz clock of the high-speed oscillator 30 by 6, and using the resulting signal to clock the swallow counter. The swallow count value can thereby be used to delay the final clock pulse output by the swallow counter 38.

Figure 5:
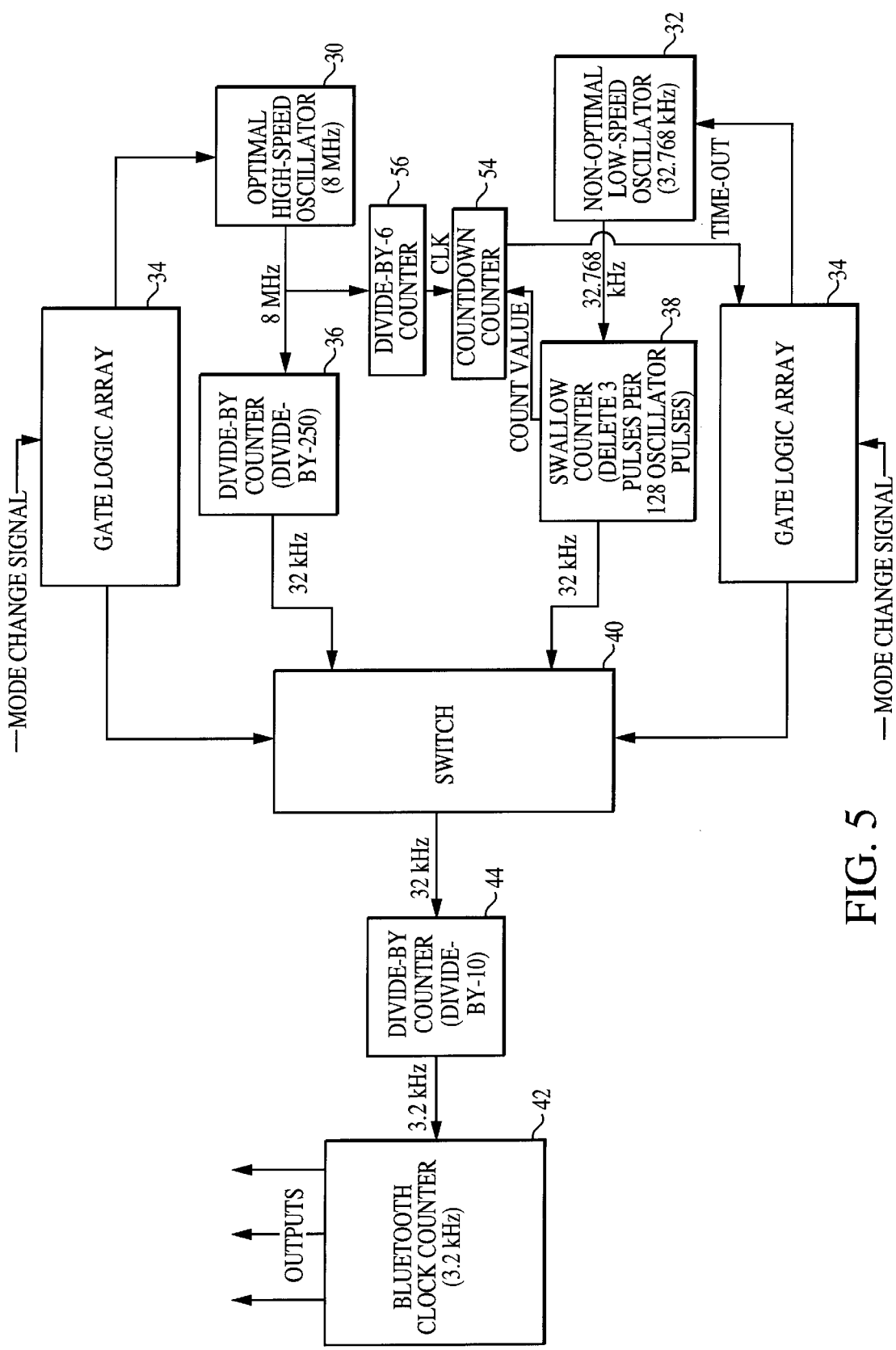
FIG. 5 shows a block diagram of one embodiment of a Bluetooth timer made in accordance with the present invention wherein the timer implements the second error-correction technique for correcting a time error.

FIG. 5 shows a block diagram of one embodiment of a Bluetooth-enabled timer, wherein the timer implements the second error-correction technique of the present invention. As shown in FIG. 5, an approximate correction is injected into the Bluetooth timer at the switch 40, as generated by a countdown counter 54. The countdown counter 54 is operatively coupled to the switch 40, a divide-by-6 counter 56 and a swallow counter 38. The countdown counter 54 receives inputs from the outputs of the divide-by-6 counter 56 and the swallow counter 38. The divide-by-6 counter 56 is operatively coupled to and receives input from the outputs of the high-speed 8 MHz oscillator 30.

In accordance with the second error-correction technique of the present invention, the approximate correction as set forth in Equation 1 is implemented using a delay-correction technique. When the timer changes modes of operation from a sleep mode to an on-the-air mode, the correction delay can be determined as follows. First, the swallow counter 38 outputs a count value that is provided as input to a countdown counter 54. At the same time, the low-speed 32.768 kHz oscillator 32 is powered off. Second, the high-speed 8 MHz oscillator 30 is powered on and outputs an 8 MHz clock signal to the clock input of a divide-by-6 counter 56. Third, the divide-by-6 counter 56 produces a clock signal that is used to clock the countdown counter 54 and cause the counter 54 to count down to a zero value. The countdown counter 54 generates a "time-out" signal that is provided as input to the gate logic array 34. The countdown counter 54 thereby outputs a delay that is based on the swallow counter 38 input value and also based on the clock that is generated by the divide-by-6 counter 56.

In accordance with this second error correction technique, the gate logic array 34 causes the output of the switch 40 to switch its output between the two 32 kHz clock signals (that signal generated by the swallow counter 38 and that signal generated by the divide-by-250 counter 36) when the countdown counter 54 value reaches zero (i.e., the countdown counter 54 "times-out"). Although this embodiment of the second technique of the present invention implements Equation 1 utilizing the divide-by-6 counter 56 and the countdown counter 54, the present invention is not so limited as one of ordinary skill in the art shall recognize that alternative methods of implementing Equation 1 can be used.

Alternatively, the high accuracy oscillator 30 can be replaced by a 2 MHz high accuracy oscillator in some applications of the timer of FIG. 5. In this alternative, a slightly different delay error correction scheme should be used to achieve the required correction delay period. As before, the goal is to convert the value stored in the swallow counter 38 into an appropriate delay as measured in microseconds. As the swallow counter 38 ranges from 0 to 40, the goal is to achieve a delay ranging from 0 to 30 microseconds. One approach is to force the count down range to be between 0 to 60. This can be achieved by modifying the contents of the swallow counter 38 to become equal to the current value of the swallow counter plus the current value shifted to the right by one bit. Alternatively, instead of shifting the current value to the right one bit, the upper (most significant) 5 bits of the 6-bit swallow counter can be used, which effectively divides the swallow counter value by a factor of 2. Using either approach, the current value of the swallow counter 38 is effectively multiplied by a constant of 1.5. This count down value can then be used three consecutive times (i.e., count the resultant value down three times) using the 2 MHz oscillator output. Alternatively, the resultant count down value can be decremented to zero only once by clocking the countdown timer 54 using the 2 MHz clock output divided by 3.

Figure 6:
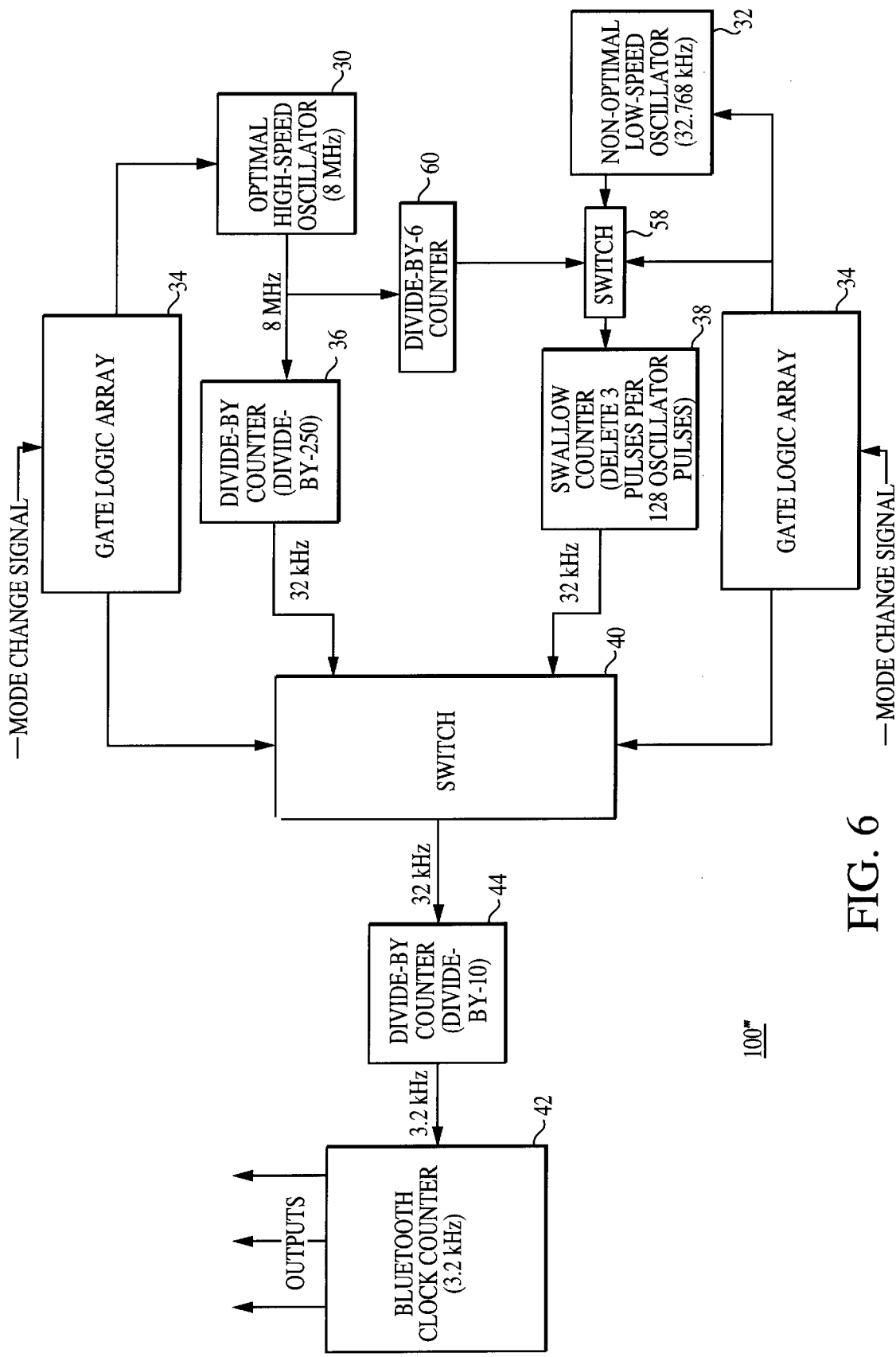
FIG. 6 shows a block diagram of an alternative embodiment the Bluetooth timer of FIG. 5.

FIG. 6 shows a block diagram of yet another alternative embodiment of a Bluetooth enabled timer 100''' of the present invention implementing the second error-correction technique for correcting timing errors. As shown in FIG. 6, an approximate correction is injected into the Bluetooth timer using a switch 58 and a divide-by-6 counter 60. The divide-by-6 counter 60 is operatively coupled to the high-speed 8 MHz oscillator 30 and the switch 58. The switch 58 is operatively coupled to the divide-by-6 counter 60, the low-speed 32.768 kHz oscillator 32, the gate logic array 34, and the swallow counter 38. The switch 58 is controlled by the gate logic array 34. The switch 58 receives a divide-by-6 count value from the divide-by-6 counter 60. The switch 58 also receives as input a 32.768 kHz clock signal from the low-speed 32.768 kHz oscillator 32. The switch 58 outputs a clock signal to the input of the swallow counter 38.

The approximate error correction defined above in Equation 1 is implemented as a delay through the swallow counter 38. When the timer changes modes from a sleep mode to an on-the-air mode, the delay is implemented in accordance with the following steps. First, the gate logic array 34 switches the output of the switch 58 from the low-speed 32.768 kHz oscillator 32 input to the divide-by-6 counter 60 input. Second, the gate logic array 34 powers on the high-speed 8 MHz oscillator 30. Third, the divide-by-6 counter 60 is clocked by the 8 MHz clock signal that is generated by the high-speed 8 MHz oscillator 30. Fourth, the output of the divide-by-6 counter 60 clock signal clocks the swallow counter 38 through the switch 58. Fifth, the swallow counter 38 outputs a delay value to the divide-by-10 counter 44 via the switch 40. Last, the gate logic array 34 switches the output of the switch 40 from the swallow counter 38 input to the divide-by-250 counter 36 input. Although this alternative embodiment of the second technique of the present invention implements Equation 1 utilizing a divide-by-6 counter 60 and a switch 58, the present invention is not so limited as one of ordinary skill in the art shall recognize that alternative methods of implementing Equation 1 through alternative delay-type means can be used without departing from the scope of the present invention.

A Third Technique for Correcting a Time Interval Error in a Bluetooth Timer

A third error-correction technique for correcting a time error in a Bluetooth enabled timer of the present invention relies upon the observation that a sleep-mode interval can be estimated using an external microprocessor or equivalent processing mechanism. In accordance with this technique, an approximate error can be determined based upon the estimated sleep-mode interval. When the timer changes modes from an on-the-air mode to a sleep mode of operation, the contents of the divide-by-250 counter 36 (FIG. 2) can be read, the corrected value can be determined, and this value can be written back into the divide-by-250 counter 36. This results in the first clock pulse generated by the divide-by-250 counter 36 to occur at a corrected offset. Thus, the correction is implemented utilizing an approximate error from an estimated sleep-mode interval.

Summary

In summary, the high-precision timer method and apparatus of the present invention includes a powerful and inexpensive means for utilizing at least two oscillators in a high-precision timer. The present high-precision timer method and apparatus uses a combination of a timer construction and an error-correction technique. Advantageously, the present invention reduces power consumption through utilization of an inexpensive low-power, low-speed oscillator. In addition, the time synchronization techniques of the present invention allow a timer correction to be implemented when switching modes from a sleep mode of operation to an on-the-air mode of operation in a Bluetooth-enabled device.

A number of embodiments of the present invention have been described. Nevertheless, it will be understood that various modifications may be made without departing from the spirit and scope of the invention. For example, the present inventive method and apparatus can use any one of three error-correction techniques. One such example is an approximate correction that is implemented using a divide-by-2 counter and a shift register. In another example, an approximate correction is implemented using a divide-by-6 counter and a countdown counter.

In addition, although examples of the present invention have been described in the context of Bluetooth-enabled devices, the present invention can be used to implement any timing device that uses two or more clock sources as inputs. Furthermore, although hardware embodiments have been described, the present invention can be implemented in both hardware and software, or completely in software. Accordingly, it is to be understood that the invention is not to be limited by the specific illustrated embodiment, but only by the scope of the appended claims.

What is claimed is:

1. A high-precision interval timer comprising:
   a) at least one high-speed optimal oscillator generating at least one high frequency optimal clock signal;
   b) a divide-by counter, operatively coupled to the at least one high frequency optimal clock signal, wherein the divide-by counter divides down the at least one high frequency optimal clock signal thereby producing a divided-down optimal clock signal;
   c) a non-optimal low-speed oscillator generating a low frequency non-optimal clock signal;
   d) a swallow counter, operatively coupled to the low frequency non-optimal clock signal, wherein the swallow counter deletes selected pulses of the low frequency non-optimal clock signal over a pre-determined time period, and wherein the swallow counter thereby outputs a swallow counter clock signal having a desired frequency;
   e) a switch means, operatively coupled to the swallow counter and the divide-by counter; and
   f) a mode change means, operatively coupled to the switch means, wherein the mode change means causes the switch means to route the divided-down optimal clock signal to an output of the switch means when the interval timer is in a first mode of operation, and wherein the mode change means causes the switch means to route the swallow counter clock signal to the output of the switch means when the interval timer is in a second mode of operation.

2. The high-precision interval timer as defined in claim 1, wherein the at least one high-speed optimal oscillator comprises a high-speed 8 MHz oscillator, and wherein the non-optimal low-speed oscillator comprises a 32.768 MHz oscillator.

3. The interval timer as defined in claim 1, wherein the high-precision interval timer is used in a device that conforms to a Bluetooth Specification.

4. The interval timer as defined in claim 3, wherein the mode change means comprises a logic gate array.

5. The interval timer as defined in claim 3, wherein the switch means routes the divided-down optimal clock signal to the output of the switch means when the device is operating in an on-the-air mode of operation, and wherein the switch means routes the swallow counter clock signal to the output of the switch means when the device is operating in a sleep mode of operation.

6. The interval timer as defined in claim 5, wherein the mode change means receives a mode change signal indicative of the device's mode of operation.

7. A method of generating a timing signal for use in an electronic device using at least one high-speed optimal oscillator and a non-optimal low-speed oscillator, wherein the at least one high-speed optimal oscillator generates at least one high frequency optimal clock signal, and wherein the non-optimal oscillator generates a non-optimal clock signal, the method comprising the steps of:
   (a) dividing the optimal clock signal by a desired constant to produce a selected divided-down optimal clock signal;
   (b) deleting selected pulses of the non-optimal clock signal to produce a swallowed non-optimal clock signal;
   (c) determining a mode of operation for the electronic device; and
   (d) outputting the divided-down optimal clock signal when the device is in a first mode of operation as determined in step (c), and outputting the swallowed non-optimal clock signal when the device is in a second mode of operation as determined in step (c).

8. The method of generating a timing signal for use in an electronic device as set forth in claim 7, wherein the first mode of operation is an on-the-air mode, and wherein the second mode of operation is a sleep mode.

9. The method of generating a timing signal for use in an electronic device as set forth in claim 7, wherein the determining step (c) comprises accepting instructions from a Bluetooth-enabled device indicative of the devices mode of operation.

10. An apparatus for implementing a high-precision interval timer utilizing an optimal and a non-optimal oscillator, wherein the high-precision interval timer comprises a switching means, a clock counter, a switch and at least two counters electronically connected to at least two non-optimal oscillators, wherein the at least two non-optimal oscillators further comprise a high-accuracy non-optimal oscillator and a low-accuracy non-optimal oscillator, and wherein the at least two counters further comprise a first counter electronically connected to the high-accuracy non-optimal oscillator and a second counter electronically connected to the low-accuracy non-optimal oscillator, wherein the switch is electronically connected to the first counter and the second counter, wherein the clock counter is electronically connected to the switch, the high-accuracy non-optimal oscillator and the low-accuracy non-optimal oscillator, comprising:
   (a) means for receiving a signal indicating a mode change wherein the high-precision interval timer utilizes the high-accuracy non-optimal oscillator;
   (b) means for determining a total error from operating the high-precision interval timer utilizing the low-accuracy non-optimal oscillator;
   (c) means for correcting the high-precision interval timer based on the total error; and
   (d) means for switching from operating the high-precision interval timer utilizing the low-accuracy non-optimal oscillator to operating the high-precision interval timer utilizing the high-accuracy non-optimal oscillator.

* * * * *